(12) United States Patent
Nagasawa et al.

(10) Patent No.: US 11,388,842 B2
(45) Date of Patent: Jul. 12, 2022

(54) ELECTRIC DEVICE

(71) Applicant: SHARP KABUSHIKI KAISHA, Sakai (JP)

(72) Inventors: Akira Nagasawa, Sakai (JP); Kenta Kawashima, Sakai (JP); Masayuki Kihara, Sakai (JP); Masateru Ueki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 63 days.

(21) Appl. No.: 16/927,519

(22) Filed: Jul. 13, 2020

(65) Prior Publication Data
US 2021/0267089 A1    Aug. 26, 2021

Related U.S. Application Data

(60) Provisional application No. 62/979,045, filed on Feb. 20, 2020.

(51) Int. Cl.
| | |
|---|---|
| *H05K 7/00* | (2006.01) |
| *H05K 7/20* | (2006.01) |
| *H05K 1/16* | (2006.01) |
| *H05K 1/02* | (2006.01) |

(52) U.S. Cl.
CPC ......... *H05K 7/2049* (2013.01); *H05K 1/0212* (2013.01); *H05K 1/16* (2013.01); *H05K 7/20536* (2013.01)

(58) Field of Classification Search
CPC ...... H05K 7/2049; H05K 1/0212; H05K 1/16; H05K 7/20536
See application file for complete search history.

(56) References Cited

U.S. PATENT DOCUMENTS

| | | | | |
|---|---|---|---|---|
| 9,823,718 | B2* | 11/2017 | Platt | ............... H05K 9/0007 |
| 2013/0088836 | A1* | 4/2013 | Kuroda | ............... H01L 23/34 |
| | | | | 361/700 |
| 2015/0327394 | A1* | 11/2015 | Davis | ............... H01L 23/3677 |
| | | | | 361/720 |
| 2017/0064880 | A1* | 3/2017 | Lin | ............... G06F 1/20 |

FOREIGN PATENT DOCUMENTS

JP    2015-026670 A    2/2015

\* cited by examiner

*Primary Examiner* — Pete T Lee
(74) *Attorney, Agent, or Firm* — ScienBiziP, P.C.

(57) ABSTRACT

An electric device includes an electric component mounted on a circuit board, a cabinet, a heat conducting member, and an elastic portion. The cabinet faces the circuit board. The heat conducting member has heat conductivity, a first contact portion that is in contact with the electric component, and at least one second contact portion that is in contact with the cabinet. The elastic portion has elasticity in a direction in which the circuit board and the cabinet face each other. The first contact portion and the second contact portion are separated from each other in the direction in which the circuit board and the cabinet face each other. The elastic portion applies an elastic force to at least one of the first contact portion and the second contact portion in a direction in which the first contact portion and the second contact portion are separated from each other.

6 Claims, 7 Drawing Sheets

ELECTRIC DEVICE

TECHNICAL FIELD

The present invention relates to an electric device.

BACKGROUND ART

Japanese Unexamined Patent Application Publication No. 2015-26670 describes a heat dissipation device including graphite rubber. Graphite rubber is fixed to a semiconductor module (electric component) mounted on a substrate (circuit board). Further, the graphite rubber is in contact with a graphite sheet attached to a housing (cabinet).

SUMMARY OF INVENTION

The main object of the present disclosure is to provide an electric device with which an electric component can be improved.

An electric device according to a first aspect includes an electric component, a cabinet, a heat conducting member, and an elastic portion. The electric component is mounted on a circuit board. The cabinet faces the circuit board. The heat conducting member has heat conductivity, a first contact portion that is in contact with the electric component, and at least one second contact portion that is in contact with the cabinet. The elastic portion has elasticity in a direction in which the circuit board and the cabinet face each other. The first contact portion and the second contact portion are separated from each other in the direction in which the circuit board and the cabinet face each other. The elastic portion applies an elastic force to at least one of the first contact portion and the second contact portion in a direction in which the first contact portion and the second contact portion are separated from each other.

In a second aspect of the electric device according to the first aspect, the elastic portion is formed separately from the heat conducting member.

In a third aspect of the electric device according to the second aspect, the second contact portion is fixed to the cabinet. The elastic portion is disposed between the first contact portion and the cabinet, and applies an elastic force to the first contact portion.

In a fourth aspect of the electric device according to any one of the first to third aspects, the heat conducting member is formed in a sheet shape.

In a fifth aspect of the electric device according to any one of the first to fourth aspects, the at least one second contact portion includes a plurality of second contact portions. The first contact portion is formed between at least any two of the plurality of second contact portions.

In a sixth aspect of the electric device according to any one of the first to fifth aspects, the elastic portion is a spring.

In a seventh aspect of the electric device according to any one of the first to sixth aspects, the cabinet has heat conductivity.

DESCRIPTION OF EMBODIMENTS

The embodiments and modification examples described below are merely examples of the present disclosure, and the present disclosure is not limited to the embodiments and modification examples. In addition to these embodiments and modification examples, various modifications can be made according to the design and the like as long as they do not deviate from the technical idea of the present disclosure.

Embodiment

Figure 1:
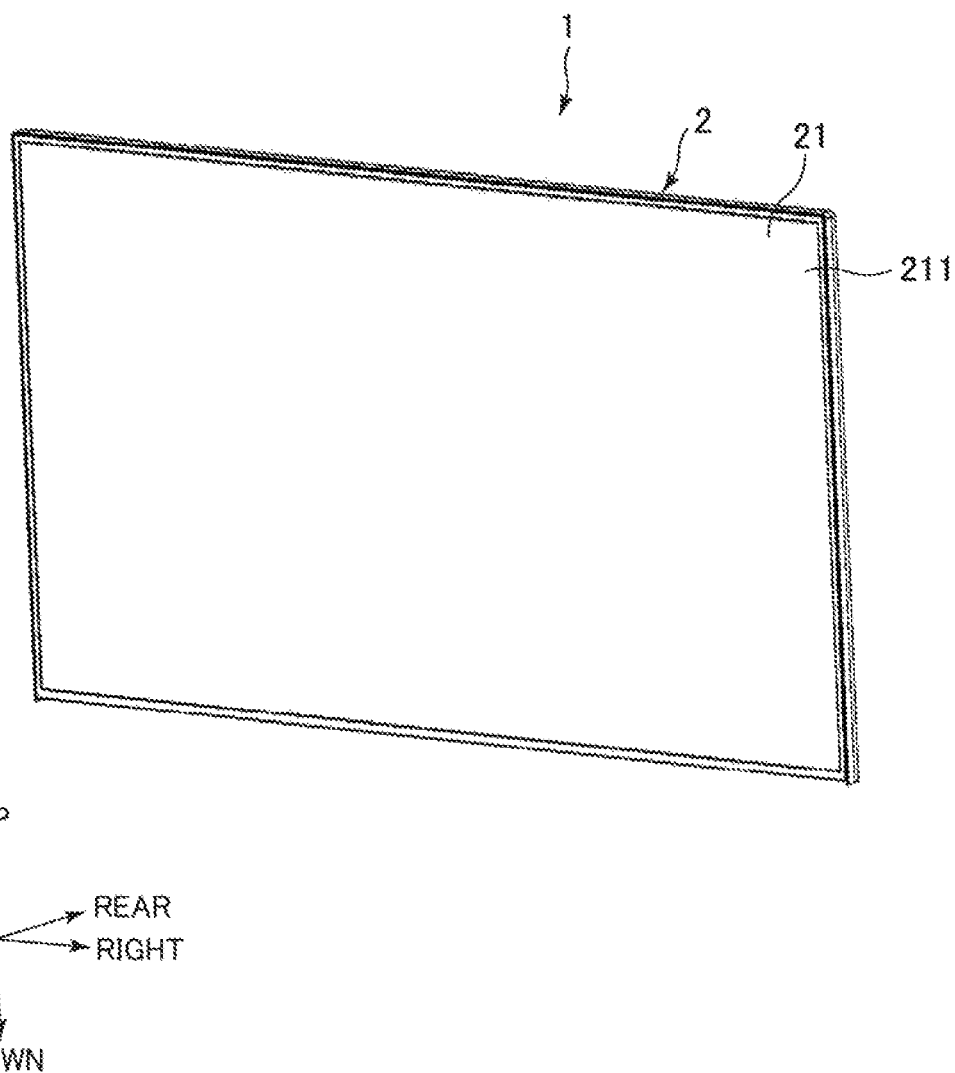
FIG. 1 is an external perspective view of an electric device according to an embodiment.
Figure 2:
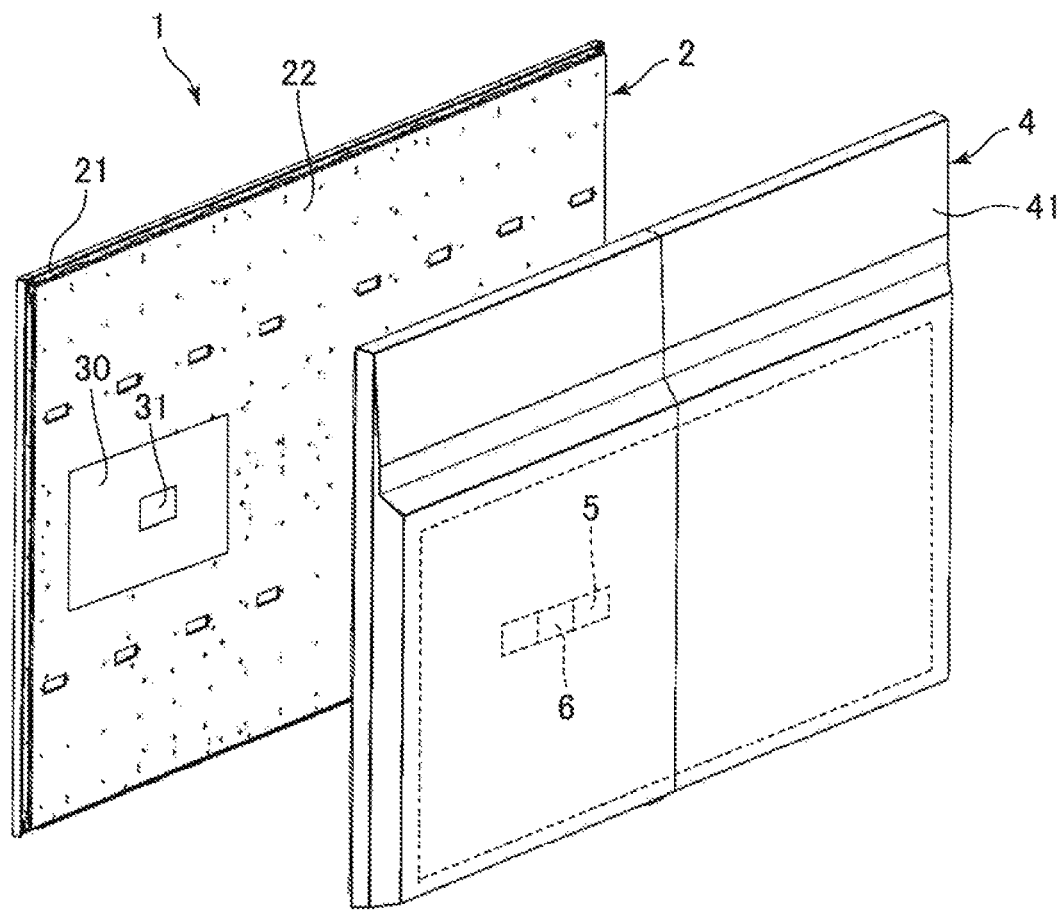
FIG. 2 is an exploded perspective view of the electric device.
Figure 2:
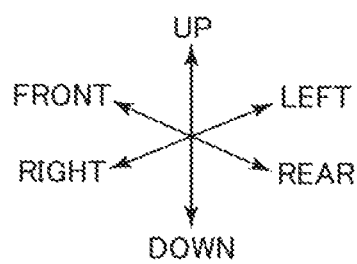

An electric device 1 according to the present embodiment will be described with reference to FIGS. 1 to 3.

In the present embodiment, a case will be described as an example where the electric device 1 is a display device 1 that displays images such as moving images and still images. In the following description, the electric device 1 may be referred to as the display device 1.

In the present embodiment, the display device 1 includes a receiving circuit for receiving a television broadcast signal from an antenna, a display circuit for displaying a video image based on the received television broadcast signal, and the like, and also functions as a television receiving device.

In the following, description will be given with reference to the directions indicated by the arrows of up, down, left, right, front, and rear in FIG. 1. However, these directions are directions specified for convenience of description, and are not intended to limit the directions in use.

The display device 1 includes a panel module 2, a circuit board 30, an electric component 31, a cabinet 4, a heat conducting member 5, and an elastic portion 6.

The panel module 2 includes a display panel 21 and a chassis 22.

The display panel 21 is formed in a rectangular shape in plan view, and is configured to display an image on the front surface as a display surface 211. The display panel 21 includes a liquid crystal panel, an optical sheet group, a light guide plate, and the like disposed in order from the front. The panel module 2 further includes a light source unit. The light guide plate is configured to guide the light emitted from the light source unit to the optical sheet group. The light from the light source is uniformly applied to the back surface of the liquid crystal panel by the light guide plate and the optical sheet group. The liquid crystal panel displays an image on the display surface 211 by changing the light transmittance according to a control signal from the drive circuit.

The chassis 22 is formed of a metal plate that is rectangular in plan view. The chassis 22 is disposed so as to entirely cover the display panel 21 from the rear, and supports the display panel 21.

The circuit board 30 is a printed wiring board (PWB) in which foil conductors are wired, and is formed in a rectangular plate shape. The circuit board 30 is fixed to the rear surface of the chassis 22. Specifically, the circuit board 30 is fixed to the chassis 22 with a cylindrical boss in between so as not to come into contact with the chassis 22. Although only one circuit board 30 is shown in FIG. 2, the electric device 1 may include a plurality of circuit boards 30.

The electric component 31 is, for example, a resistor, a capacitor, an inductor, a transistor, an integrated circuit (IC), or the like, and is mounted on the circuit board 30. The electric component 31 is mounted on the circuit board 30 to form an electric circuit. The electric circuit is, for example, a power supply circuit that supplies electric power to a light source unit, a drive circuit, and the like. The electric circuit is not limited to the power supply circuit and may be another circuit (for example, a drive circuit or a control circuit). Actually, a plurality of electric components 31 are mounted on the circuit board 30. However, in FIG. 2, one electric component 31 out of the plurality of electric components 31 is schematically illustrated as a representative example.

The cabinet 4 is configured to entirely cover the panel module 2, the circuit board 30, and the like from the rear. As shown in FIG. 3, the cabinet 4 has a base 41 and a heat diffusion portion 42.

The base 41 is a synthetic resin cover with an open front, and covers the chassis 22, the circuit board 30, and the like from the rear so that the chassis 22, the circuit board 30, and the like are not exposed.

The heat diffusion portion 42 is made of a member having heat conductivity. In the present embodiment, the heat diffusion portion 42 is made of graphite. "Having heat conductivity" in the present disclosure means having heat conductivity higher than heat conductivity of a synthetic resin such as acrylonitrile butadiene styrene (ABS) resin. The heat conductivity of synthetic resin is about 0.2 [W/(m·K)], while the heat conductivity of the heat diffusion portion 42 is about 600 to 2000 [W/(m·K)]. The heat conductivity of the heat diffusion portion 42 is preferably 100 times or more, and more preferably 1000 times or more the heat conductivity of the synthetic resin.

The heat diffusion portion 42 is formed in a sheet shape, and is provided on the front surface of the base 41. Therefore, in the portion of the base 41 where the heat diffusion portion 42 is provided, heat is diffused by the heat diffusion portion 42, and the local temperature difference is reduced. Further, in the heat diffusion portion 42, the heat conductivity in the plane direction orthogonal to the thickness direction is higher than the heat conductivity in the thickness direction. This further reduces the local temperature difference of the base 41.

As described above, the cabinet 4 of the present embodiment has a configuration in which the heat diffusion portion 42 is provided on the base 41, and thus has heat conductivity.

In the present embodiment, the heat diffusion portion 42 is made of graphite, but may be made of a metal such as copper or silver. Further, in the present embodiment, the cabinet 4 has the heat conductivity by including the heat diffusion portion 42, but the heat diffusion portion 42 is not an essential component. For example, the cabinet 4 may be configured to have heat conductivity by including the metal base 41.

The heat conducting member 5 is made of a member having heat conductivity. In the present embodiment, the heat conducting member 5 may be made of graphite. The heat conductivity of the heat conducting member 5 is about 600 to 2000 [W/(m·K)]. For example, the heat conductivity of the heat conducting member 5 is preferably 100 times or more, and more preferably 1000 times or more the heat conductivity of synthetic resin such as ABS resin.

Figure 3:
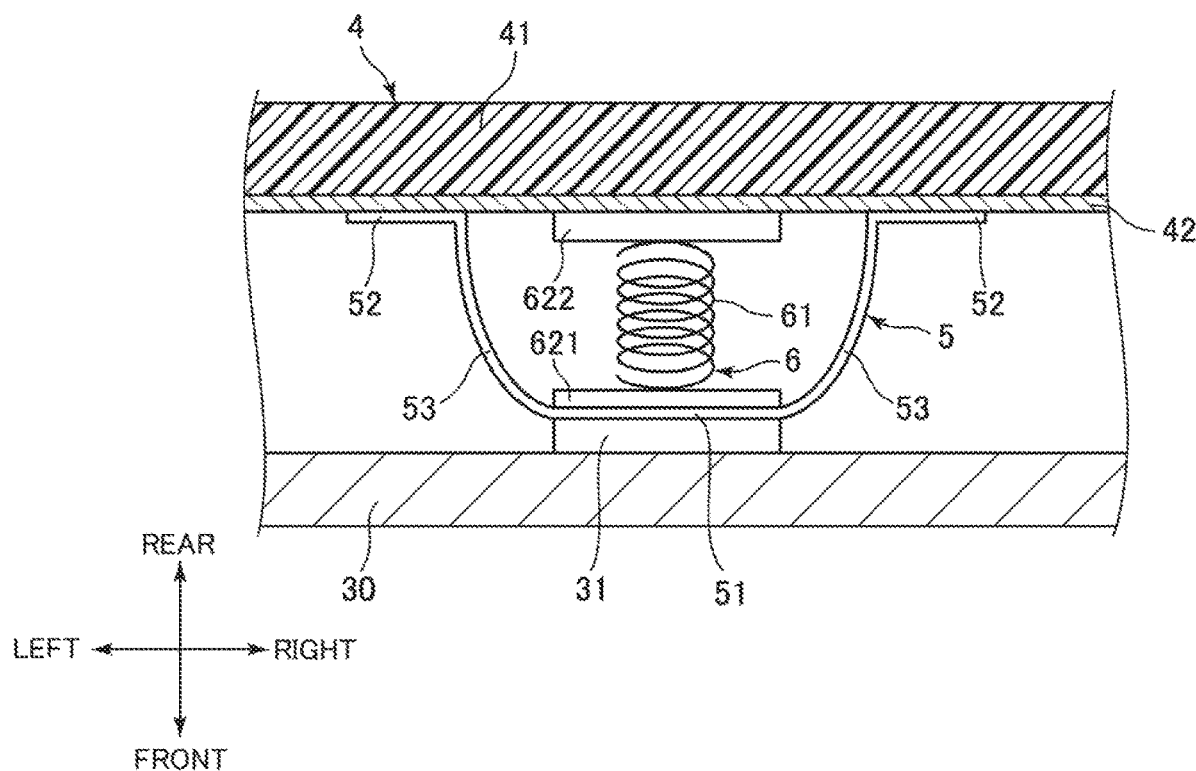
FIG. 3 is a schematic configuration view of an elastic portion and a heat conducting member in the electric device.

As shown in FIG. 3, the heat conducting member 5 has a first contact portion 51, a pair of second contact portions 52, and a pair of connecting portions 53. The heat conducting member 5 is formed in a rectangular sheet shape. The second contact portion 52, the connecting portion 53, the first contact portion 51, the connecting portion 53, and the second contact portion 52 are configured in this order from one end side of the heat conducting member 5 in the longitudinal direction. In the heat conducting member 5, the heat conductivity in the plane direction orthogonal to the thickness direction is higher than the heat conductivity in the thickness direction.

The first contact portion 51 is a central portion of the heat conducting member 5 in the longitudinal direction. The heat conducting member 5 is provided such that the first contact portion 51 is in contact with the electric component 31 mounted on the circuit board 30. By the contact with the electric component 31, heat is directly transferred between the first contact portion 51 and the electric component 31. In other words, the first contact portion 51 is thermally coupled to the electric component 31.

The second contact portion 52 is an end portion of the heat conducting member 5 in the longitudinal direction. In the present embodiment, the heat conducting member 5 includes the pair of second contact portions 52. One of the pair of second contact portions 52 is one end portion of the heat conducting member 5 in the longitudinal direction, and the other of the pair of second contact portions 52 is the other end portion of the heat conducting member 5 in the longitudinal direction. Therefore, the first contact portion 51 is formed between the two second contact portions 52.

The heat conducting member 5 is provided such that the second contact portion 52 is in contact with the cabinet 4. By the contact with the cabinet 4, heat is directly transferred between the second contact portion 52 and the cabinet 4. In other words, the second contact portion 52 is thermally coupled to the cabinet 4. In the present embodiment, the heat conducting member 5 is provided such that the second contact portion 52 is in contact with the heat diffusion portion 42 in the cabinet 4. Therefore, the second contact portion 52 is thermally coupled to the heat diffusion portion 42 in the cabinet 4, and heat is directly transferred between the second contact portion 52 and the heat diffusion portion 42.

The connecting portion 53 is a portion of the heat conducting member 5 between the first contact portion 51 and the second contact portion 52. In the present embodiment, the heat conducting member 5 includes the pair of connecting portions 53. One of the pair of connecting portions 53 is a portion between the first contact portion 51 and corresponding one of the second contact portions 52, and the other of the pair of connecting portions 53 is a portion between the first contact portion 51 and the other corresponding one of the second contact portions 52.

As described above, the heat conducting member 5 is provided such that the first contact portion 51 is in contact with the electric component 31 mounted on the circuit board 30 and the second contact portion 52 is in contact with the cabinet 4. Therefore, the first contact portion 51 and the second contact portion 52 are separated from each other in the front-rear direction in which the circuit board 30 and the cabinet 4 face each other.

In the present embodiment, the second contact portion 52 is fixed to the cabinet 4. For example, the second contact portion 52 is fixed to the cabinet 4 with an adhesive, a double-sided tape, or the like. On the other hand, the first contact portion 51 is in contact with the electric component 31 but is not fixed to the electric component 31.

Further, the heat conducting member 5 has flexibility and is formed such that the pair of connecting portions 53 bends. That is, the length of the connecting portion 53 is longer than the length between the electric component 31 and the cabinet 4. The "length of the connecting portion 53" in the present disclosure is a dimension along the surface between the first contact portion 51 and the second contact portion 52 adjacent to the connecting portion 53.

As shown in FIG. 3, the elastic portion 6 has a spring 61, a first contact plate 621, and a second contact plate 622, and is disposed between the cabinet 4 and the first contact portion 51 of the heat conducting member 5.

The spring 61 is a coil spring made of metal and has elasticity. The spring 61 is provided so as to be sandwiched between the first contact plate 621 and the second contact plate 622.

The first contact plate 621 is provided such that one surface of the first contact plate 621 is in contact with one end of the spring 61 and the other surface of the first contact plate 621 is in contact with the first contact portion 51. The second contact plate 622 is provided such that one surface of the second contact plate 622 is in contact with the other end of the spring 61 and the other surface of the second contact plate 622 is in contact with the heat diffusion portion 42 of the cabinet 4.

The elastic portion 6 is disposed between the cabinet 4 and the first contact portion 51 in a state where the spring 61 is elastically deformed so as to contract. Therefore, the elastic portion 6 applies an elastic force on the cabinet 4 and the first contact portion 51. In other words, the elastic portion 6 applies an elastic force to the first contact portion 51 in a direction in which the first contact portion 51 and the second contact portion 52 are separated from each other.

Further, in the present embodiment, the length of the spring 61 of the elastic portion 6 is shorter than the natural length and longer than the adhesion length. Therefore, the elastic portion 6 is disposed in a state that the spring 61 can expand and contract between the cabinet 4 and the first contact portion 51.

Further, in the present embodiment, since the elastic portion 6 has the spring 61 (coil spring), it also has elasticity in the direction orthogonal to the expansion/contraction direction of the spring 61. That is, the elastic portion 6 has elasticity in the front-rear direction in which the circuit board 30 and the cabinet 4 face each other and in the direction orthogonal to the front-rear direction.

As described above, the display device 1 of the present embodiment includes the heat conducting member 5. The heat conducting member 5 is disposed between the circuit board 30 and the cabinet 4, and has the first contact portion 51 that is in contact with the electric component 31 mounted on the circuit board 30, second contact portions 52 that are in contact with the cabinet 4, and connecting portions 53 that each connect the first contact portion 51 and the second contact portion 52. Since the first contact portion 51 is in contact with the electric component 31, heat is directly transferred between the first contact portion 51 and the electric component 31. Since the second contact portion 52 is in contact with the cabinet 4, heat is directly transferred between the second contact portion 52 and the cabinet 4. That is, the heat generated by driving the electric component 31 can be transferred to the cabinet 4 via the first contact portion 51, the connecting portion 53, and the second contact portion 52. In other words, the heat generated from the electric component 31 can be transferred to the cabinet 4 via the heat conducting member 5.

Further, the display device 1 of the present embodiment includes the elastic portion 6. The elastic portion 6 is disposed between the first contact portion 51 and the cabinet 4, and applies an elastic force to the first contact portion 51 in the direction in which the first contact portion 51 and the second contact portion 52 are separated from each other. That is, the elastic portion 6 applies an elastic force to the first contact portion 51 so as to press the first contact portion 51 against the electric component 31. As a result, since the adhesion between the first contact portion 51 and the electric component 31 is improved and the heat transfer efficiency between the first contact portion 51 and the electric component 31 is improved, the heat dissipation of the electric component 31 is improved.

Figure 4:
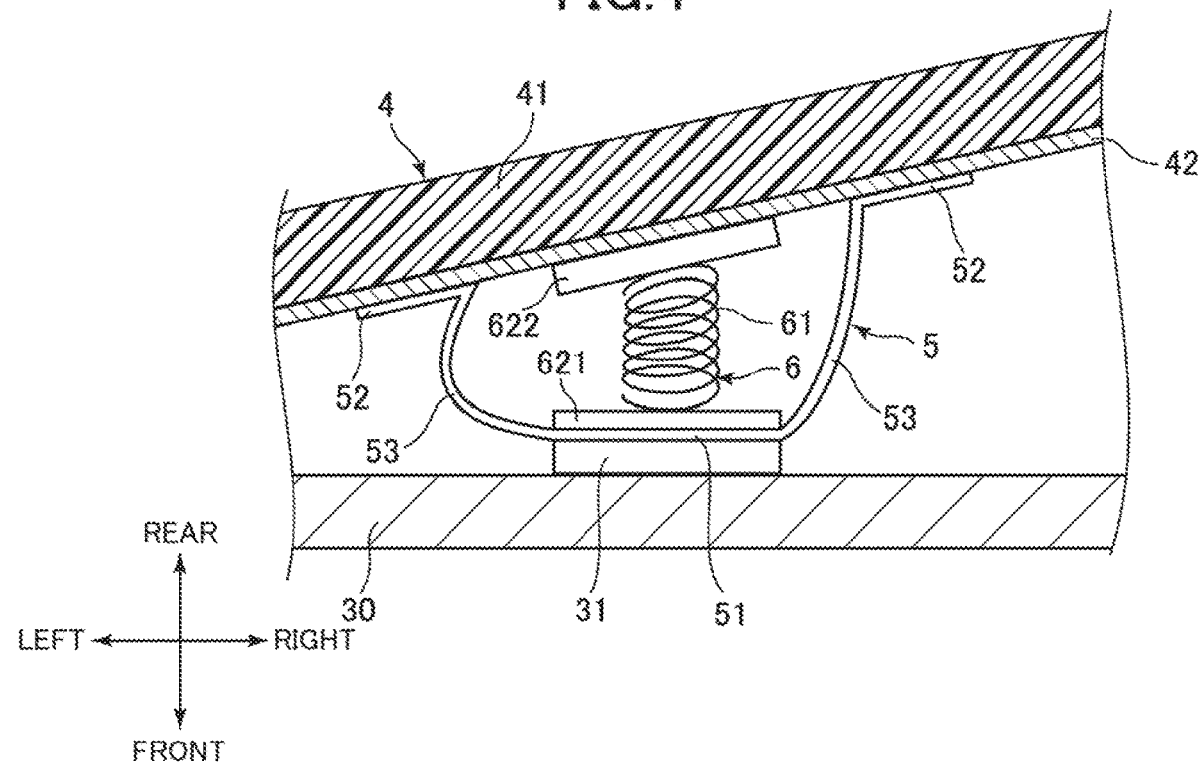
FIG. 4 is a view showing a state of the elastic portion and the heat conducting member when a cabinet of the electric device is deformed.

Further, as shown in FIG. 4, when the cabinet 4 is deformed due to heat, aging, and the like, the distance between the electric component 31 and the cabinet 4 may change. FIG. 4 shows, as an example, a case in which the cabinet 4 is deformed so as to be inclined with respect to the circuit board 30. In FIG. 4, the deformation of the cabinet 4 is emphasized, and the cabinet 4 may be in a state different from the actually deformed state. In the display device 1 of the present embodiment, the elastic portion 6 elastically changes so as to follow the change of the cabinet 4, and therefore the elastic portion 6 can apply an elastic force to the first contact portion 51 so as to press the first contact portion 51 against the electric component 31. Therefore, even if the cabinet 4 is deformed, the contact state between the first contact portion 51 and the electric component 31 can be maintained, and thus the heat dissipation of the electric component 31 can be maintained.

Here, as a comparative example, there is a configuration in which graphite rubber is sandwiched between the electric component 31 and the cabinet 4 to transfer the heat of the electric component 31 to the cabinet 4. However, graphite rubber has a relatively low elastic modulus. Therefore, when the cabinet 4 is deformed and the distance between the electric component 31 and the cabinet 4 is changed, the graphite rubber cannot follow the deformation of the cabinet 4. A gap is generated between the graphite rubber and the electric component 31 or between the graphite rubber and the cabinet 4, and the heat dissipation of the electric component 31 is reduced.

On the other hand, since the display device 1 of the present embodiment is provided with the elastic portion 6 as described above, a gap between the heat conducting member 5 and the electric component 31 and between the heat conducting member 5 and the cabinet 4 can be suppressed from being generated, and the heat dissipation of the electric component 31 is maintained.

Further, in the present embodiment, the heat conducting member 5 includes two second contact portions 52. Therefore, the heat conducting member 5 has a contact area with the cabinet 4 larger than a contact area in the case where the second contact portion 52 is one. As a result, the heat transfer efficiency between the heat conducting member 5 and the cabinet 4 is improved, and therefore the heat dissipation of the electric component 31 is improved.

Figure 5:
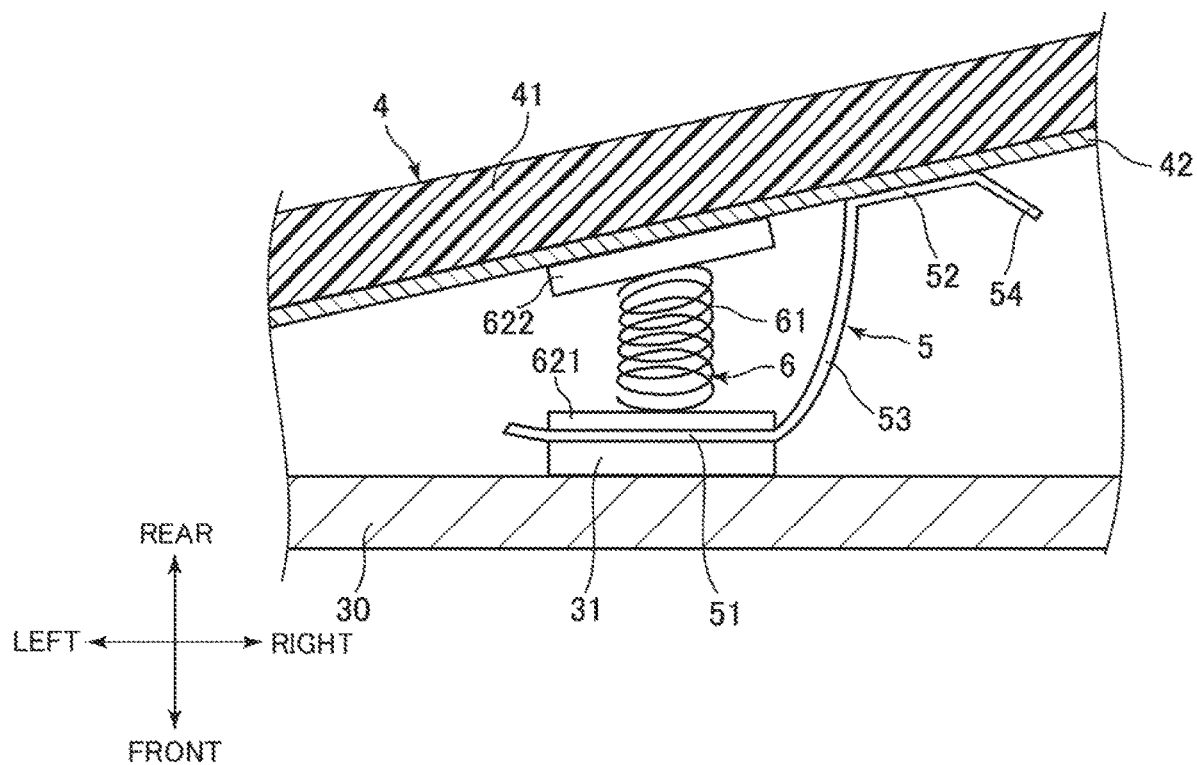
FIG. 5 is a schematic configuration view of a heat conducting member of a modification example.

It is not essential that the heat conducting member 5 has a plurality of second contact portions 52. As shown in FIG. 5, the heat conducting member 5 may have one second contact portion 52. Further, as shown in FIG. 5, the heat conducting member 5 may be formed to include an extension portion 54 extending from the second contact portion 52. That is, the second contact portion 52 does not have to be the end portion of the heat conducting member 5.

The second contact portion 52 is in contact with the heat diffusion portion 42 of the cabinet 4. Therefore, the heat transferred from the electric component 31 to the cabinet 4 via the heat conducting member 5 is diffused by the heat diffusion portion 42. As a result, the local temperature rise in the cabinet 4 is suppressed from occurring, and deformation of the cabinet 4 due to heat or the like can be suppressed from occurring.

In the cabinet 4, it is not essential that the cabinet 4 has heat conductivity, and the heat diffusion portion 42 may be omitted.

Further, the elastic portion 6 has the first contact plate 621 sandwiched between the spring 61 and the first contact portion 51 and the elastic force of the spring 61 is applied to the first contact portion 51 via the first contact plate 621. Therefore, the elastic portion 6 has an increased area in which the elastic force is applied to the first contact portion 51, as compared with the configuration in which the first contact plate 621 is not provided. As a result, since the adhesion between the first contact portion 51 and the electric component 31 is improved and the heat transfer efficiency between the first contact portion 51 and the electric component 31 is improved, the heat dissipation of the electric component 31 is improved.

Further, the elastic portion 6 has the second contact plate 622 sandwiched between the spring 61 and the cabinet 4. Therefore, since the elastic portion 6 has a larger contact area with the cabinet 4 as compared with the configuration in which the second contact plate 622 is not provided, the displacement of the elastic portion 6 with respect to the cabinet 4 can be suppressed from occurring.

In the present embodiment, the elastic portion 6 has the first contact plate 621 and the second contact plate 622. However, the first contact plate 621 and the second contact plate 622 may be omitted, or only one of the first contact plate 621 and the second contact plate 622 may be included.

Further, in the heat conducting member 5, the two second contact portions 52 are fixed to the cabinet 4. Therefore, since the first contact portion 51 formed between the two second contact portions 52 and the cabinet 4 can hold the elastic portion 6 so as to be sandwiched, the elastic portion 6 is easily installed, and the assembling property of the display device 1 is improved.

Further, since the spring 61 in the elastic portion 6 is a metal coil spring, it is easy to adjust the size between the electric component 31 and the cabinet 4, the magnitude of the elastic force to be applied to the first contact portion 51, and the like by adjusting the number of turns, the wire diameter, and the like. Further, since the spring 61 is a coil spring made of metal, the change in elastic force due to heat is relatively small.

Modification Example

Next, a modification example of the display device 1 will be described. The respective modification examples described below can be applied by appropriately combining the configurations of the embodiment described above or modification examples. In the following description, the same components as those in the embodiment described above will be denoted by the same reference numerals and description thereof will be omitted as appropriate.

First Modification Example

Figure 6:
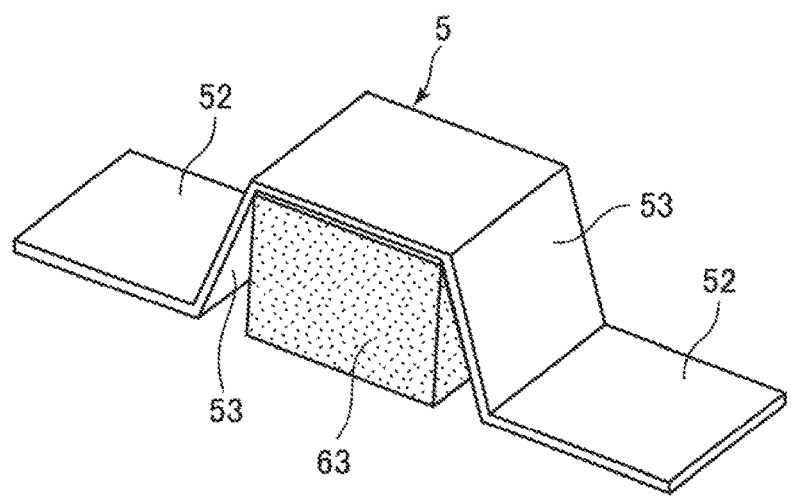
FIG. 6 is a schematic configuration view of an elastic portion of a first modification example.

In the example described above, the elastic portion 6 has the spring 61, but the present invention is not limited to this. As shown in FIG. 6, the elastic portion 6 may have a structure including a resin foam body 63 such as polyurethane foam. The foam body 63 is formed in a rectangular shape and has elasticity. The foam body 63 is disposed between the cabinet 4 and the first contact portion 51 in an elastically deformed state. As a result, the elastic portion 6 applies an elastic force to the first contact portion 51.

Figure 7:
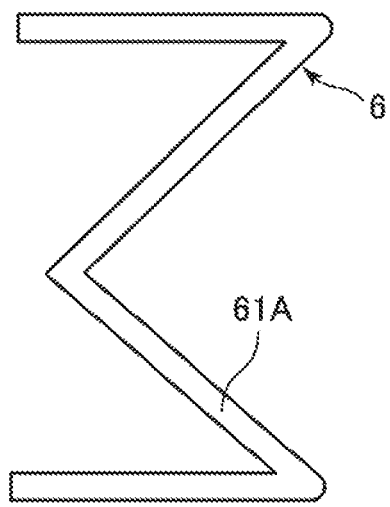
FIG. 7 is a schematic configuration view of an elastic portion of a second modification example.
Figure 8:
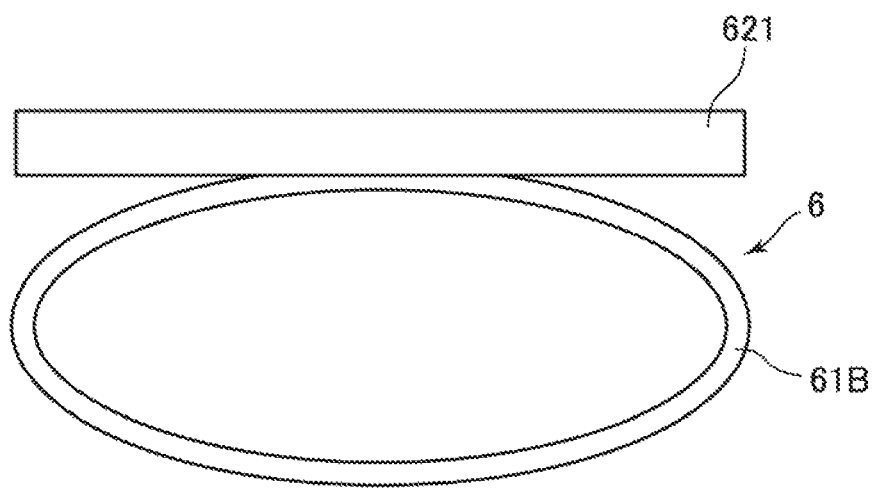
FIG. 8 is a schematic configuration view of an elastic portion of a third modification example.

Further, in the example described above, the elastic portion 6 has a configuration including the spring 61 that is a coil spring, but the type of spring is not limited to the coil spring. The elastic portion 6 may have a spring 61A (see FIG. 7) which is a bent leaf spring, or may have a spring 61B (see FIG. 8) which is a leaf spring formed in an elliptic cylinder shape. In the example shown in FIG. 8, the elastic portion 6 further includes the first contact plate 621 sandwiched between the first contact portion 51 and the spring 61. The material of the springs 61A and 61B may be metal or resin.

Second Modification Example

Figure 9:
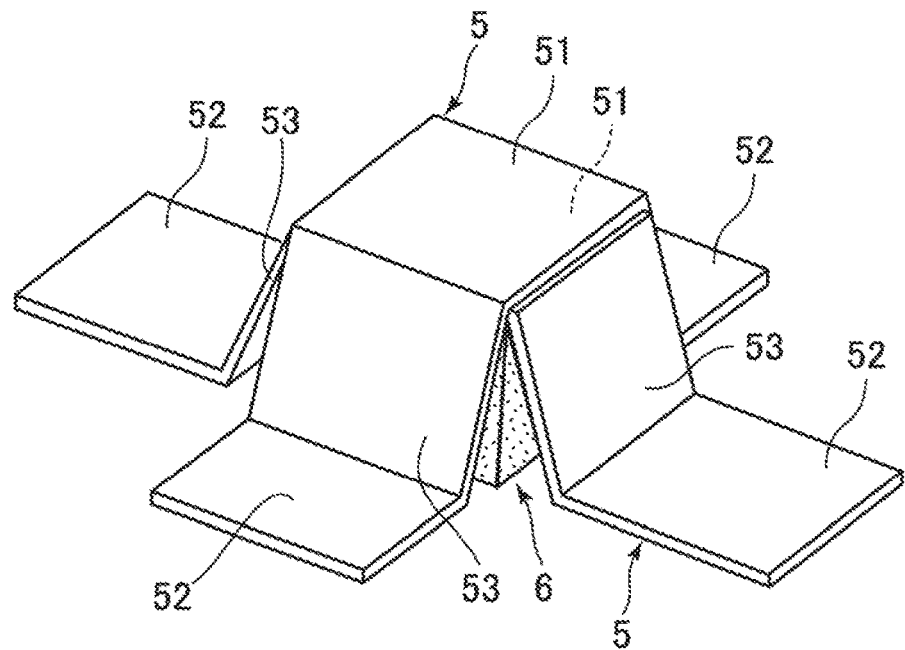
FIG. 9 is a view showing an example of arrangement of two heat conducting members.
Figure 10:
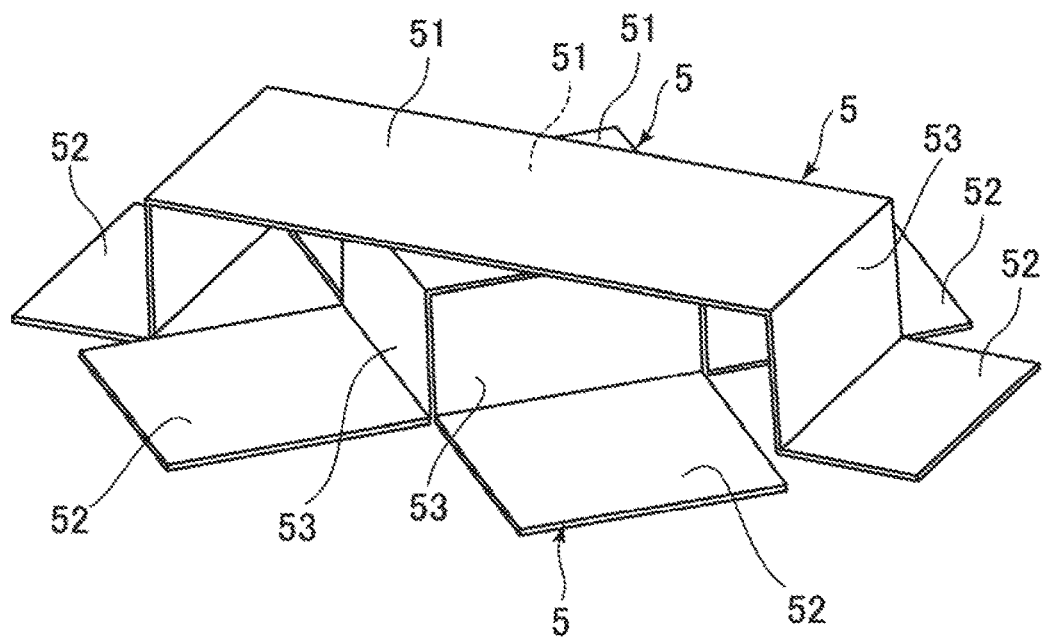
FIG. 10 is a view showing an example of arrangement of three heat conducting members.

In the example described above, the display device 1 has a configuration including one heat conducting member 5 but the configuration is not limited to this, and may include a plurality of heat conducting members 5. In the example shown in FIG. 9, two heat conducting members 5 are provided such that the first contact portions 51 overlap each other and the second contact portions 52 do not overlap each other. In the example shown in FIG. 10, three heat conducting members 5 are provided such that the first contact portions 51 overlap each other and the second contact portions 52 do not overlap each other. The display device 1 of the present modification example has the plurality of heat conducting members 5. Therefore, as compared with the configuration having one heat conducting member 5, the contact area between the plurality of heat conducting members 5 and the cabinet 4 is increased, and the heat transfer efficiency between the electric component 31 and the cabinet 4 improves, and therefore the heat dissipation of the electric component 31 further improves.

In this way, by adjusting the number of the heat conducting members 5, the heat transfer efficiency between the electric component 31 and the cabinet 4 can be adjusted.

Figure 11:
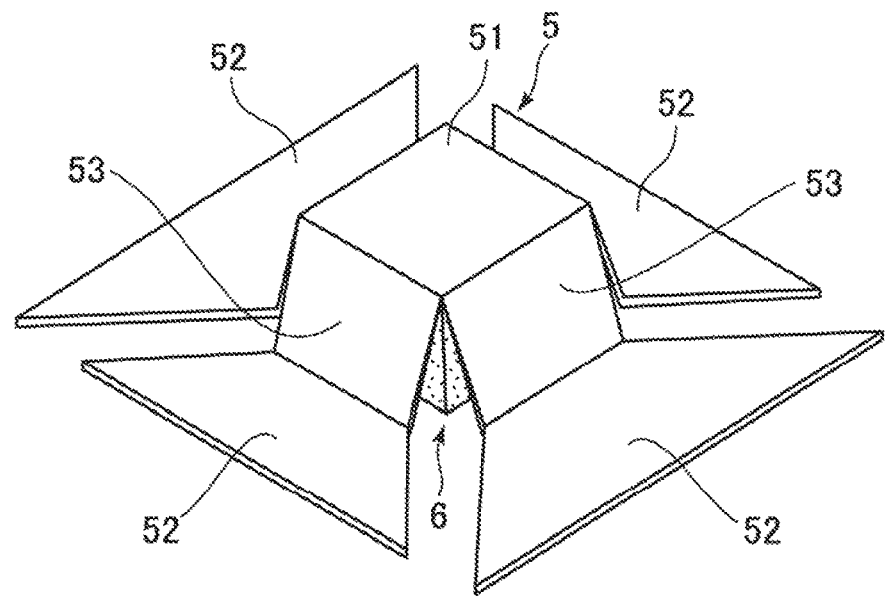
FIG. 11 is a schematic configuration view of a heat conducting member of a modification example.

Further, in the example described above, the heat conducting member 5 has a configuration having one or two second contact portions 52, but it may have a configuration having three or more second contact portions 52. In the example shown in FIG. 11, the heat conducting member 5 has four second contact portions 52. The four second contact portions 52 are connected to the first contact portion 51 having a rectangular shape at the four sides with the connecting portions 53 in between. Since the heat conducting member 5 has the four second contact portions 52, the heat conducting member 5 has a larger contact area with the cabinet 4 as compared with the configuration having the two second contact portions 52, and therefore the heat transfer efficiency between the electric component 31 and the cabinet 4 is improved, and the heat dissipation of the electric component 31 is further improved. Further, in the example shown in FIG. 11, since each of the second contact portions 52 is formed in a trapezoidal shape, the contact area with the cabinet 4 is further increased, and the heat dissipation of the electric component 31 is further improved.

In this way, by adjusting the number and size of the second contact portions 52 of one heat conducting member 5, the heat transfer efficiency between the electric component 31 and the cabinet 4 can be adjusted.

Other Modification Examples

Figure 12:
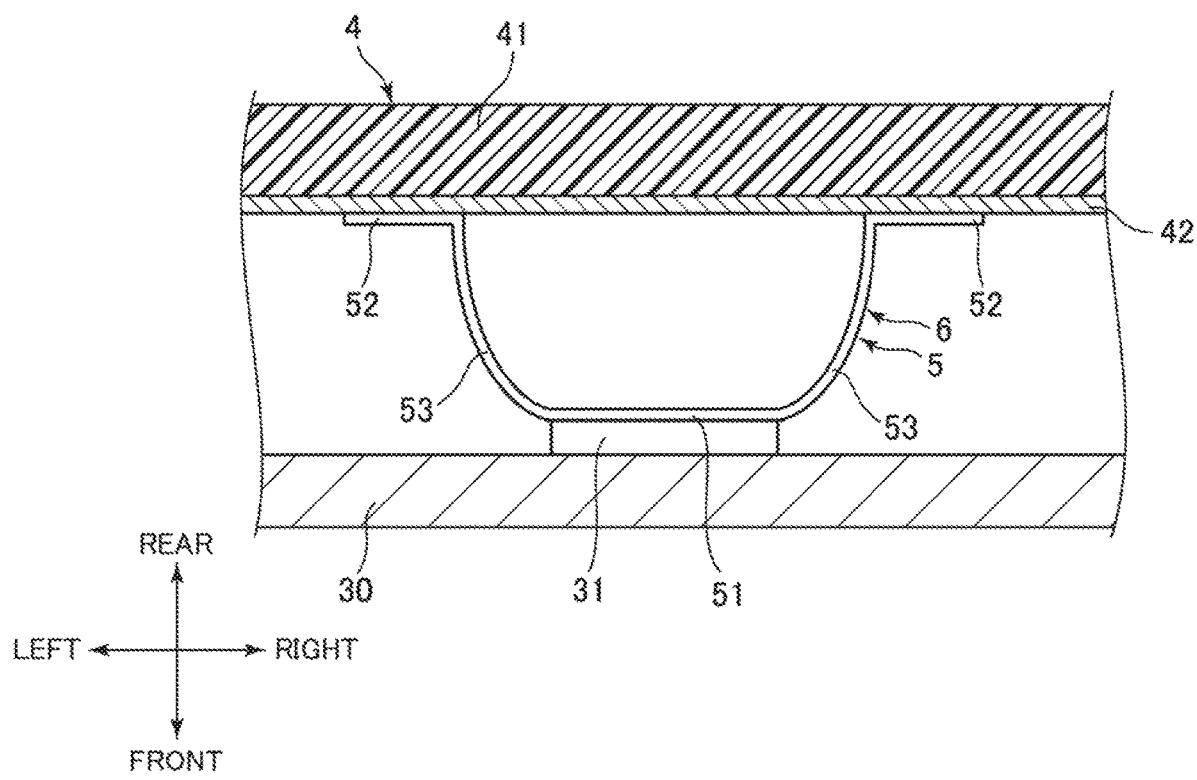
FIG. 12 is a schematic configuration view in which the elastic portion and the heat conducting member are integrally formed.

In the example described above, the elastic portion 6 is formed separately from the heat conducting member 5, but the elastic portion 6 is not limited to this. As shown in FIG. 12, the elastic portion 6 may be integrally formed with the heat conducting member 5. In this case, the connecting portion 53 provided so as to bend between the first contact portion 51 and the second contact portion 52 functions as the elastic portion 6.

Further, in the example described above, the heat conducting member 5 is bent in the direction in which the second contact portion 52 is separated from the first contact portion 51, but the second contact portion 52 may be bent so as to face the first contact portion 51. In this case, the elastic portion 6 is disposed between the first contact portion 51 and the second contact portion 52, and applies an elastic force to both the first contact portion 51 and the second contact portion 52 such that the first contact portion 51 and the second contact portion 52 are separated from each other. That is, the elastic portion 6 applies an elastic force so as to press the first contact portion 51 against the electric component 31 and applies an elastic force so as to press the second contact portion 52 against the cabinet 4. As a result, the adhesion between the first contact portion 51 and the electric component 31 is improved, and the adhesion between the second contact portion 52 and the cabinet 4 is improved. Therefore, since the heat transfer efficiency between the electric component 31 and the cabinet 4 is improved, the heat dissipation of the electric component 31 is improved.

Further, in the example described above, although the second contact portion 52 is fixed to the cabinet 4, the second contact portion 52 is not limited to this and may not be fixed to the cabinet 4.

Further, in the example described above, the first contact portion 51 is not fixed to the electric component 31, but the first contact portion 51 is not limited to this, and may be fixed to the electric component 31. In this case, the elastic portion 6 may be configured to apply the elastic force to the second contact portion 52.

Further, in the example described above, the heat conducting member 5 is made of graphite, but the heat conducting member 5 is not limited to this, and may be made of a sheet-shaped metal, for example.

Further, in the example described above, the electric device 1 is the display device 1, but it is not limited to the display device 1 and may be another device (for example, a recorder for recording video images, a personal computer, a smartphone, and the like).

What is claimed is:

1. An electric device comprising:
an electric component mounted on a circuit board;
a cabinet facing the circuit board;
a heat conducting member having heat conductivity, a first contact portion that is in contact with the electric component, and at least one second contact portion that is in contact with the cabinet; and
an elastic portion having elasticity in a direction in which the circuit board and the cabinet face each other,
wherein the first contact portion and the second contact portion are separated from each other in the direction in which the circuit board and the cabinet face each other,
the elastic portion applies an elastic force to at least one of the first contact portion and the second contact portion in a direction in which the first contact portion and the second contact portion are separated from each other, and
the heat conducting member is formed in a sheet shape.

2. The electric device according to claim 1,
wherein the elastic portion is formed separately from the heat conducting member.

3. The electric device according to claim 2,
wherein the second contact portion is fixed to the cabinet, and
the elastic portion is disposed between the first contact portion and the cabinet, and applies an elastic force to the first contact portion.

4. The electric device according to claim 1,
wherein the at least one second contact portion includes a plurality of second contact portions, and
the first contact portion is formed between at least any two of the plurality of second contact portions.

5. The electric device according to claim 1,
wherein the elastic portion is a spring.

6. The electric device according to claim 1,
wherein the cabinet has heat conductivity.

* * * * *